United States Patent [19]

Asprey et al.

[11] Patent Number: 5,276,404
[45] Date of Patent: Jan. 4, 1994

[54] CONSTANT CURRENT VIDEO AMPLIFIER

[75] Inventors: Robert R. Asprey, Harvest; Thomas V. Lusk, Scottsboro, both of Ala.

[73] Assignee: Cybex Corporation, Huntsville, Ala.

[21] Appl. No.: 912,689

[22] Filed: Jul. 13, 1992

[51] Int. Cl.$^5$ ............................ H03F 3/04; H04N 5/14
[52] U.S. Cl. ........................ 330/147; 330/302; 330/311; 358/181; 358/184
[58] Field of Search ............ 330/147, 302, 303, 304, 330/305, 306, 310, 311; 328/154; 358/181, 184

[56] References Cited

U.S. PATENT DOCUMENTS

| | | | |
|---|---|---|---|
| 3,323,070 | 5/1967 | Hayes | 330/302 X |
| 3,426,288 | 2/1969 | Giorgetti | 330/305 |
| 3,578,901 | 5/1971 | Griepentrog | 358/184 X |
| 3,702,898 | 11/1972 | Webb | 358/181 |

FOREIGN PATENT DOCUMENTS

| | | | |
|---|---|---|---|
| 243721 | 9/1960 | Australia | 330/326 |
| 1177219 | 9/1964 | Fed. Rep. of Germany | 330/306 |
| 212007 | 11/1984 | Japan | 330/311 |

Primary Examiner—James B. Mullins
Attorney, Agent, or Firm—Phillips & Beumer

[57] ABSTRACT

This invention is a constant current, noninverting, voltage amplifier powered by a single polarity of electrical power with respect to a ground potential. In a preferred embodiment, the amplifier consists essentially of a single transistor having a reference voltage applied to a base input thereof and an analog video signal coupled via a resistor to an emitter of the transistor. Also coupled to the emitter is a constant current source, with a collector of the transistor coupled to a monitor.

6 Claims, 1 Drawing Sheet

CONSTANT CURRENT VIDEO AMPLIFIER

FIELD OF THE INVENTION

This invention generally relates to analog video amplifiers and particularly to a constant current video amplifier for strengthening degraded video or other analog signals.

BACKGROUND OF THE INVENTION

There are many occasions where it is necessary to regenerate or otherwise restore computer video signals to their transmitted amplitudes. In one such instance, when analog VGA video and keyboard signals are routed between one of a plurality of computers and a single monitor and keyboard by switching equipment, such as the Commander module manufactured by Cybex Corporation of Huntsville, Ala., analog VGA video levels routed thereby may be reduced and high frequency components of the signal attenuated by switching circuitry inside the Commander module.

In another instance, where analog video and other data signals are coupled to or between workstations via relatively long conductors, similar signal losses occur. In order to compensate for these signal losses, it is generally necessary to regenerate voltage amplitude of the video and data signals prior to inputting them to a monitor and other peripheral devices. Typically, such regeneration is done by a pair of transistors coupled in a common emitter configuration, with the first transistor inverting the signal and the second transistor reinverting the signal in order to provide noninverted voltage amplification. While this type of amplifier requires power of a single polarity and ground, DC coupling of the amplifiers is generally difficult to implement and not particularly stable.

Accordingly, it is an object of this invention to provide a video and data regeneration circuit that is simple in construction and which possesses a voltage gain factor sufficient to boost a weak analog video signal to a conventional, usable amplitude.

Additionally, it is an object of this invention to provide a single transistor, noninverting, constant current voltage amplifier with controlled gain disposed to operate with a single polarity source of DC power with respect to ground and which is configurable to be a high frequency amplifier, a bandpass or tuned amplifier, a broadband amplifier, or a low frequency amplifier, each having a significantly high gain factor in their amplifying regions.

SUMMARY OF THE INVENTION

A noninverting, constant current voltage amplifier is constructed having a transistor with an emitter coupled to a constant current source and to an analog signal via an impedance. A collector of the transistor is coupled to a monitor having a load of about 75 ohms, with a base of the transistor coupled to a reference potential. Biasing of the transistor occurs between the source of constant current applied to the emitter and the reference potential applied to the base. The amplifier functions such that current flows through the impedance when the analog signal is low, depleting current flow through the transistor to the load and lowering potential of the source of constant current, biasing the transistor to a less conductive state. As the analog signal increases, current through the impedance is reduced because of a lower voltage drop across the impedance, allowing more current to flow through the transistor to the load and also biasing the transistor to a more conductive state.

DESCRIPTION OF THE PREFERRED EMBODIMENT

Figure 1:
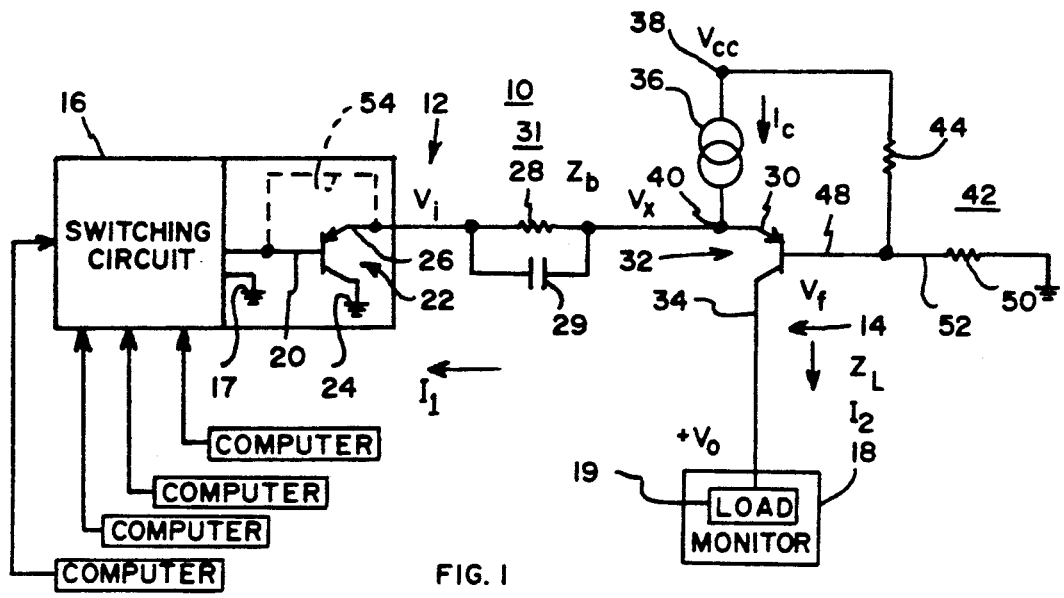
FIG. 1 is a schematic view of a video regeneration circuit generally representative of the present invention.

Referring initially to FIG. a noninverting, constant current voltage amplifier 10 is shown having an input region 12 and an output region 14. Input region 12 is coupled, in a preferred embodiment, to a routed source 16 of degraded analog video signals, such as found in the aforementioned Commander module, with resultant lowered amplitude and attenuation of high frequency components of the signal. In this embodiment wherein the Commander module is used, the output analog video signal is provided by an emitter 26 of a PNP transistor 22 in the Commander module. Output region 14 of amplifier 10 is coupled to a load having known characteristics, such as an analog video monitor 18 or other analog device, with amplifier 10 providing a noninverted, amplified representation of the input signal across the load. Where the output is coupled to a conventional analog VGA computer monitor 18, the monitor represents a load 19, which may be a resistor of about 75 ohms, with the output signal from region 14 across this 75 ohm load being about 700 millivolts. In this instance, it is to be appreciated that there would be a discrete circuitry 10 for each of the discrete video signals which, in the instance of a VGA monitor, include primary red, green, and blue analog signals. While this circuitry in the preferred embodiment is to be implemented with respect to the currently manufactured Commander module, it will be apparent to those skilled in the art that numerous other applications exist where noninverting analog amplification is required or desired.

Network 31, a bypass impedance for diverting current flow, as will be described, couples the input from emitter 26 to amplifier 10. Generally, in the Commander module, PNP transistor 22 is coupled in emitter-follower configuration and connected to network 31, with a base 20 of transistor 22 coupled to the weakened analog video signal. As such, collector 24 of transistor 22 is coupled to ground, providing an alternate current path to ground for the video signal, and emitter 26 is coupled to bypass impedance 31, illustrated in FIG. 1 as an RC network. Resistor 28 of network 31 has a value of about 20 ohms, and capacitor 29 has a value of about 220 pF, network 31 serving to divert current in a direct relationship from the load impedance responsive to positive voltage excursions of the input signal applied to base 20. Impedance 31 may be fixed to provide a fixed gain amplifier or may be variable to provide a variable gain amplifier and is coupled on an end opposite emitter 26 to emitter 30 of PNP transistor 32. Collector 34 of transistor 32 is coupled directly to analog monitor or other peripheral device 18, which transistor, in the preferred embodiment, is a 2N2907a or equivalent and is characterized by having a typical current gain of about 200 and is able to maintain constant emitter voltage for a given base voltage. A constant current source 36, which may be a resistor coupled to a stable voltage source, such as 4.5 volts, is coupled to terminal 40 between network 31 and emitter 30 and provides a current limited source of about 9.33 milliamps to be divided between network 31 and transistor 32. A voltage divider circuit 42 includes a resistor 44 coupled at one end to the 4.5 volt voltage source at terminal 38 and at an opposite end to terminal 52, also coupled to base 48 of transistor 32. A second resistor 50 is coupled at one end to a ground potential and at an opposite end to junction 52, with values of resistors 44 and 50 selected to provide a potential to base 48 of transistor 32 no lower than a highest anticipated peak input potential of the analog signal at the base of transistor 22, including any DC offset that may be present. In the Commander module, it has been found that the analog video signal may be degraded to about 450 millivolts with a positive 150-millivolt DC offset. Thus, values of resistors 44 and 50 are selected to provide about 650 millivolts to terminal 52. With the described voltages applied to transistor 32, a lowest input signal at the input diverts current flow from transistor 32 to flow through resistor 28, reducing current flow through transistor 32 and the voltage at terminal 38 to a point where transistor 32 is biased in its operating range just above its cut-off point. As the input signal increases, current flow through resistor 28 decreases, slightly increasing a voltage level at terminal 40, biasing transistor 32 to a more conductive state and resulting in more current flow through transistor 32 and in turn increasing potential across load 18 in direct relation with the input signal.

In the instance where the signal from source 16 is of lowered amplitude and is attenuated, but possesses sufficient current sourcing capabilities to drive network 31, the analog input signal is the input signal coupled directly to network 31, as represented by dashed line 54. In this configuration, resistors 44 and 50 are selected to provide a voltage at terminal 52 of about 650 millivolts below a highest anticipated peak input potential of the analog signal in order to compensate for elimination of the diode drop of transistor 22. Additionally, an output driver of routing circuit 16 would also be conventionally configured to provide an alternate current path to ground, as illustrated by ground 17. In this instance, when the input signal is at a lower state, current flows from current source 36 through network 31 to ground 17.

While the specific example described above which includes transistor 22 is an application tailored for the Commander module wherein the load is resistive in nature, a more generalized representation of the instant invention without transistor 22 may be illustrated where both load and bypass impedances are complex impedances. Theoretically, and assuming a transistor has a high current gain for transistor 32, network 31 impedance may be represented as $Z_b$, with the analog signal source voltage, with regard to ground, represented by $V_i$ which, in this instance, is coupled directly to network 31 (dashed line 54) and the highest excursion of the analog signal defined by $V_x$. Current through impedance $Z_b$ is represented as $I_1$. The voltage applied to base 48 is represented as $V_f$, and as stated, is selected to be no lower than the highest peak amplitude of the input signal $V_x$ minus the approximately 650 millivolt diode drop of the emitter-base junction of transistor 32. With such voltages applied to transistor 32, the voltage at junction 40 only fluctuates slightly due to the fixed base voltage and the forward biased emitter-base junction of transistor 32, with this slight fluctuation being sufficient to directly vary conductivity of transistor 32 and resultant current flow therethrough with respect to the input signal. This generally constant voltage at junction 40 is represented by $V_x$ (max peak amplitude), with $I_c$ being current from constant current supply 36. The load is represented by $Z_L$, a complex impedance, with current flow through the load represented as $I_2$ and voltage across the load $Z_L$ represented as $V_0$. With such designations, voltage across the load is defined by:

$$V_0 = I_2 \times Z_L$$

and the constant current into junction 40 being a sum of the output currents, or $$I_c = I_1 + I_2$$

The deflected current through impedance $Z_b$ is defined by:

$$I_1 = V_x - V_1/Z_b$$

with the inversely proportional flow of current through load $Z_1$ defined by:

$$I_2 x - I_c - I_1 = I_c - V_x - V_1/Z_b$$

and the voltage across the load defined by:

$$V_0 = Z_L I_2 = (I_c - V_x - V_1/Z_b) \times Z_L$$

For a change of input voltage $V_i$ $$VP_O = (I_c - V_x - V_1/Z_b) \times Z_L = (0 - (0 - V_1)/Z_b) \times Z_L$$

which, when resolved, becomes:

$$VO = V_1/Z_b \times ZL$$

yielding an AC gain of:

$$V_0/V_1 = Z_L/Z_b$$

Thus, it is seen that gain of the amplifier is strictly controlled by load impedance and bypass impedance. In the specific example given for the Commander module, impedance of load $Z_b$ is about 75 ohms resistive, the magnitude of impedance of network 31 at a DC potential is about 20 ohms, and at 30 mHz is about 0.6 ohms, as given by the generalized circuit analysis in the foregoing and familiar to anyone skilled in the art. Therefore, it is demonstrated that the above described amplifier of the preferred embodiment possesses frequency sensitive gain which varies from a gain of about 75/20=3.75 ($Z_L$ divided by $Z_b$) at a DC level and a gain of about 75/0.6=125 at 30 Mhz. For the various embodiments illustrated and described hereinafter, the bypass impedance is first determined and gain calculated by dividing load impedance by the bypass impedance.

Figure 2:
FIG. 2 is a schematic view of an alternate embodiment of a portion of the circuit shown in FIG. 1 which configures the circuit of FIG. as a constant current amplifier having broadband amplification characteristics.
Figure 3:
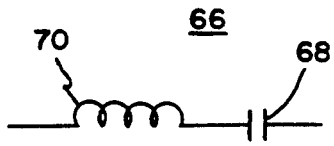
FIG. 3 is a schematic view of an alternate embodiment of a portion of the circuit shown in FIG. 1 which configures the circuit of FIG. 1 as a constant current amplifier wherein a particular frequency band is amplified with greater gain.
Figure 4:
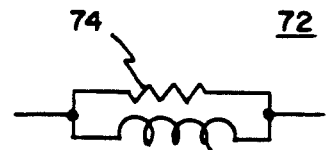
FIG. 4 is a schematic view of an alternate embodiment of a portion of the circuit shown in FIG. 1 which configures the circuit of FIG. 1 as a constant current amplifier having gain inversely proportional to frequency.

For configuring amplifier 10 to selectively amplify particular frequencies, reference is made to FIGS. 2, 3, and 4. Here, as shown in FIG. 2, a resistance 64 is substituted for network 31 in FIG. 1. This configures amplifier 10 as a broadband amplifier which has gain independent of frequency as long as the load is frequency independent. In FIG. 3, an LC network 66 including capacitor 68 and inductor 70, when substituted for network 31, provides a tuned amplifier that amplifies a particular frequency range, or band, with greater gain than frequencies on either side of the particular frequency range. Similarly, FIG. 4 illustrates an LR network 72 including resistor 74 coupled across inductor 76 which, when substituted for network 31, provides an amplifier 10 having a gain inversely proportional to frequency. Alternately, resistor 74 may be coupled in series with inductor 76 (not shown). It is significant to note that in any of the described embodiments, gain of the amplifier is the load impedance divided by the deflection impedance.

In operation, and referring to FIG. 1, a degraded analog video signal voltage referenced to ground from the Commander module taken from one of a plurality of computers (only one shown) and intended to be applied to an analog computer monitor is applied to base 20 of transistor 22. In this instance, bias voltages of transistors 22 and 32 are obtained from terminal 40, with a reference voltage of about 600 millivolts taken from terminal 38 and applied to base 48 of transistor 32. The voltage at terminal 40 is about 1.2 volts, which is a diode drop of about 650 millivolts above the reference voltage applied to base 48 and which is varied as described by transistor 22 responsive to excursions of the input signal applied to base 20.

Figure 5:
FIG. 5 is an example of an analog video waveform applied to an input region of FIG. 1.
Figure 6:
FIG. 6 is an amplified waveform of the waveform of FIG. 5 and which is applied to a monitor.

The input signal, as shown in the waveform of FIG. 5, is offset to a positive DC bias of about 150 millivolts due to switching levels in the Commander module and degraded in amplitude to have a swing of about 450 millivolts between about 150 millivolts and 600 millivolts. This signal, when at the 150-millivolt level and applied to base 20 of transistor 22, biases transistor 22 on, deflecting virtually all the 9.33 milliamps from current source 36 through 20-ohm resistor 28 due to the difference of voltage potentials on either side of resistor 28, with this current being applied to ground via transistor 22. This depletes current flow through transistor 32 and reduces voltage at terminal 40 to just above a cut-off voltage, reducing the IR voltage drop across the monitor load to 0 volts, as seen in the waveform of FIG. 6.

As the input signal applied to base 20 rises to about 600 millivolts, transistor 22 is biased toward its cut-off region, and with about 1.2 volts applied to emitter 26 from terminal 40, less current flows through network 31 due to decreasing potential difference across resistor 28. This in turn slightly increases potential at terminal 40 such that transistor 32 is biased more toward a conductive state, resulting in increasing current flow through transistor 32 to the 75-ohm load in monitor 32. As the potential across network 31 equilibrates as transistor 22 is driven toward cut-off, the entire 9.33 milliamps from constant current source 36 is shifted to flow through transistor 32 and the 75-ohm monitor load, increasing the potential across the 75-ohm load to about 700 millivolts, a conventional level for an analog monitor. As described, as the input signal fluctuates between low and high levels, the constant current is divided and fluctuates with the input signal between transistors 22 and 32.

In the absence of transistor 22, an analog video signal, extending from about 150 millivolts or lower to about 600 millivolts, is applied to network 31, and when at the lowest level, draws a highest level of current flow through network 31, which current flow is applied to ground 17, reducing potential on emitter 30 to a level to bias transistor 32 to a higher impedance, reducing output on collector 34 to 0. As the signal applied to network 31 increases, less current flows through resistor 28, increasing a potential at terminal 40 and biasing transistor 32 to a more conductive state in direct relationship with the input signal, shifting current flow to the load via transistor 32 and increasing voltage drop thereacross. In the event the input signal exceeds the reference potential applied to terminal 52, as by a noise spike, biasing transistor 32 into saturation, the load is generally protected from an overvoltage condition due to the constant current source 36 providing only 9.33 milliamps current flow to the load.

Having thus described our invention and the manner of its use, it is apparent that we have provided a noninverting, single transistor amplifier configurable for broadband, bandpass, high frequency or low frequency amplification of analog signals. Further, it is apparent that incidental modifications may be made thereto which fairly fall within the scope of the following appended claims, wherein we claim:

We claim:

1. A non-inverting, constant current voltage amplifier powered by an electrical power source of a single polarity comprising:

a first transistor having first and second terminals and a control input, said first terminal being coupled to a common signal level;

analog switching circuitry having a plurality of inputs for receiving analog video signals from a plurality of computers, and at least one output for providing, a selected one of said video signals to said control input;

an impedance coupled at one end to said second terminal of said first transistor;

a source of current and of a discrete potential with respect to said common signal level;

a second transistor having first, second, and third terminals, said first and second terminals comprising an input, and said second and third terminals comprising an output of said second transistor, said second terminal being coupled to said source of current and to an opposite end of said impedance;

an analog video monitor having a load impedance, with said third terminal of said second transistor coupled to said load impedance; and a reference potential of a like polarity as said source of current and coupled to said first terminal of said second transistor, whereby said analog video signal is amplified without signal inversion.

2. A noninverting, constant current voltage amplifier as set forth in claim 1 wherein said impedance is configured as a resistance of about 20 ohms and is a broadband amplifier.

3. A noninverting, constant current voltage amplifier as set forth in claim 1 wherein said impedance is configured as an RC network for providing said amplifier with gain directly related to frequency of said one video signal.

4. A noninverting, constant current voltage amplifier as set forth in claim 1 wherein said impedance is configured as an LC network for providing said amplifier with gain wherein a discrete frequency band is amplified.

5. A noninverting, constant current voltage amplifier as set forth in claim 1 wherein said impedance is configured as an LR network wherein gain is inversely related to frequency of said one video signal.

6. A non-inverting, constance current voltage amplifier as set forth in claim 1 wherein said second terminal of said second transistor is directly coupled to said source of current and to said opposite end of said impedance.

* * * * *